Oct. 29, 1968 H. TROEGER 3,407,677

POWER AMPLIFIER

Filed June 14, 1966 6 Sheets-Sheet 1

HENRY TROEGER
INVENTOR

BY W. S. Thompson

HENRY TROEGER
INVENTOR.
BY
W S Thompson

HENRY TROEGER
INVENTOR.

BY
W. S. Thompson

Oct. 29, 1968 H. TROEGER 3,407,677

POWER AMPLIFIER

Filed June 14, 1966 6 Sheets-Sheet 4

HENRY TROEGER
INVENTOR.

BY W. J. Thompson

Oct. 29, 1968 H. TROEGER 3,407,677

POWER AMPLIFIER

Filed June 14, 1966 6 Sheets-Sheet 5

HENRY TROEGER
INVENTOR.

BY

HENRY TROEGER
INVENTOR.

BY W. S. Thompson

United States Patent Office 3,407,677
Patented Oct. 29, 1968

3,407,677

POWER AMPLIFIER

Henry Troeger, Cooperstown, N.Y., assignor to The Bendix Corporation, a corporation of Delaware Filed June 14, 1966, Ser. No. 557,434
16 Claims. (Cl. 74—388)

ABSTRACT OF THE DISCLOSURE

A mechanical power amplifier position control unit to couple a power input to a power output and vary amplification in response to a signal input and a signal feedback. The unit has an idle state at which the output is zero and at which the amplifier has substantially no sliding friction. A reversible planetary gear reduction system is combined with a ball drive system forward and reverse control being achieved by braking various segments of the planetary gear system.

The present invention relates to a mechanical power amplifier position control unit and, more particularly, to a power amplifier position control unit for controlling the movement of aircraft control surfaces or parameters such as ailerons, rudders, elevators, turbine engine exhaust nozzles and the like.

It is an object of the present invention to provide a novel power amplifier position control unit having an output driven by a reversible planetary gear drive system in which a ball drive actuator mechanism controls the direction of rotation of the output.

In mechanical power amplifiers, it is desirable to have an output which is substantially proportional to the difference between input signal and output signal. The output signal may be a velocity signal or an average velocity over a predetermined time period, or it may be a torque signal. At times, the difference between the two signals may be sufficiently small so that the amplifier has no output. Such a condition is termed the "idle state." During the idle state, it is highly desirable to provide a mechanical power amplifier which has substantially no sliding friction so as to prolong component life and reduce amplifier heat output and improve control accuracy. Accordingly, it is an object of the present invention to provide a power amplifier position control unit which can idle without sliding friction.

It is an object of the present invention to provide a novel power amplifier position control unit which employs a reversible planetary gear reduction system in a ball drive system which is light in weight, self-contained, and has short transient response times.

It is an object of the present invention to provide a power amplifier position control unit which has equal gear speed ratios in the forward and reverse directions.

In a mechanical power amplifier position control unit employing a reversible planetary gear reduction system, forward and reverse control is achieved by braking various segments of the planetary gear system. Accordingly, in a power amplifier position control unit, it is desirable and it is an object of the present invention to provide a variable speed transmission to provide brake actuation energy for braking sections of the reversible planetary gear reduction system.

In a mechanical power amplifier having a reversible output, it is desirable to achieve a reversible output by braking or preventing the rotational actuation of sections of the power amplifier transmission. To prevent sliding or dynamic friction in the power amplifier transmission, it is highly desirable to provide braking forces which are sufficient to assure an accurate output signal which may be a position or an integrated velocity signal.

Accordingly, it is an object of the present invention to provide a rate of application of braking forces which are proportional to the difference between input signal and output position.

It is a further object of the present invention to provide a power amplifier position control unit in which brake actuation occurs only when sufficient power is available to prevent any substantial dynamic friction.

It is an object of the present invention to provide a ball drive for a power amplifier position control unit in which there is substantially no sliding or dynamic friction.

It is a further object of the present invention to provide a power amplifier position control unit in which the control section utilizes low power and dissipates little heat.

It is a further object of the present invention to provide a high power, high torque power amplifier position control unit which may be air cooled.

It is a further object of the present invention to provide a ball drive control unit for a mechanical power amplifier having a feedback cam to provide brake actuation energy proportional to the difference between input position and output position.

It is a further object of the present invention to provide a ball drive control unit for a mechanical power amplifier having a feedback cam in which the cam has a region of functionally substantially zero output so that actuation of braking or holding forces to sections of the power amplifier variable speed transmission is not effective until a predetermined minimum level of holding power is obtained.

It is a further object of the present invention to provide a power amplifier position control unit which has a novel resettable overload torque release mechanism which is simple and reliable.

It is a still further object of the present invention to provide a power amplifier position control unit in which the power input member is operative to provide power supply for the control unit and for the positioning unit.

It is a further object of the present invention to provide a mechanical friction type variable speed ratio power amplifying device having output velocity proportional to small input errors and output position proportional to large input errors.

It is an object of the present invention to provide a power unit for a position control mechanism which employs wet neutral disc brakes for smooth engagement and disengagement.

It is a further object of the present invention to provide a novel linkage to sense both input position and output position and supply that information to a variable speed drive ratio device to control the output position.

A still further object of the present invention is to have output position indicated by a threaded shaft member which is resiliently biased.

The invention further lies in the particular organization of the various elements of the system and in their cooperative association with one another to produce the beneficial results intended.

The foregoing and other objects and advantages of the invention will appear more fully hereinafter from a consideration of the detailed description which follows, taken together with the accompanying drawings wherein one embodiment of the invention is illustrated. It is to be expressly understood, however, that the drawings are for the purposes of illustration and description and are not to be constructed as defining the limits of the invention.

In the drawings wherein a power amplifier position control system embodying the invention is illustrated:

Figure 1:
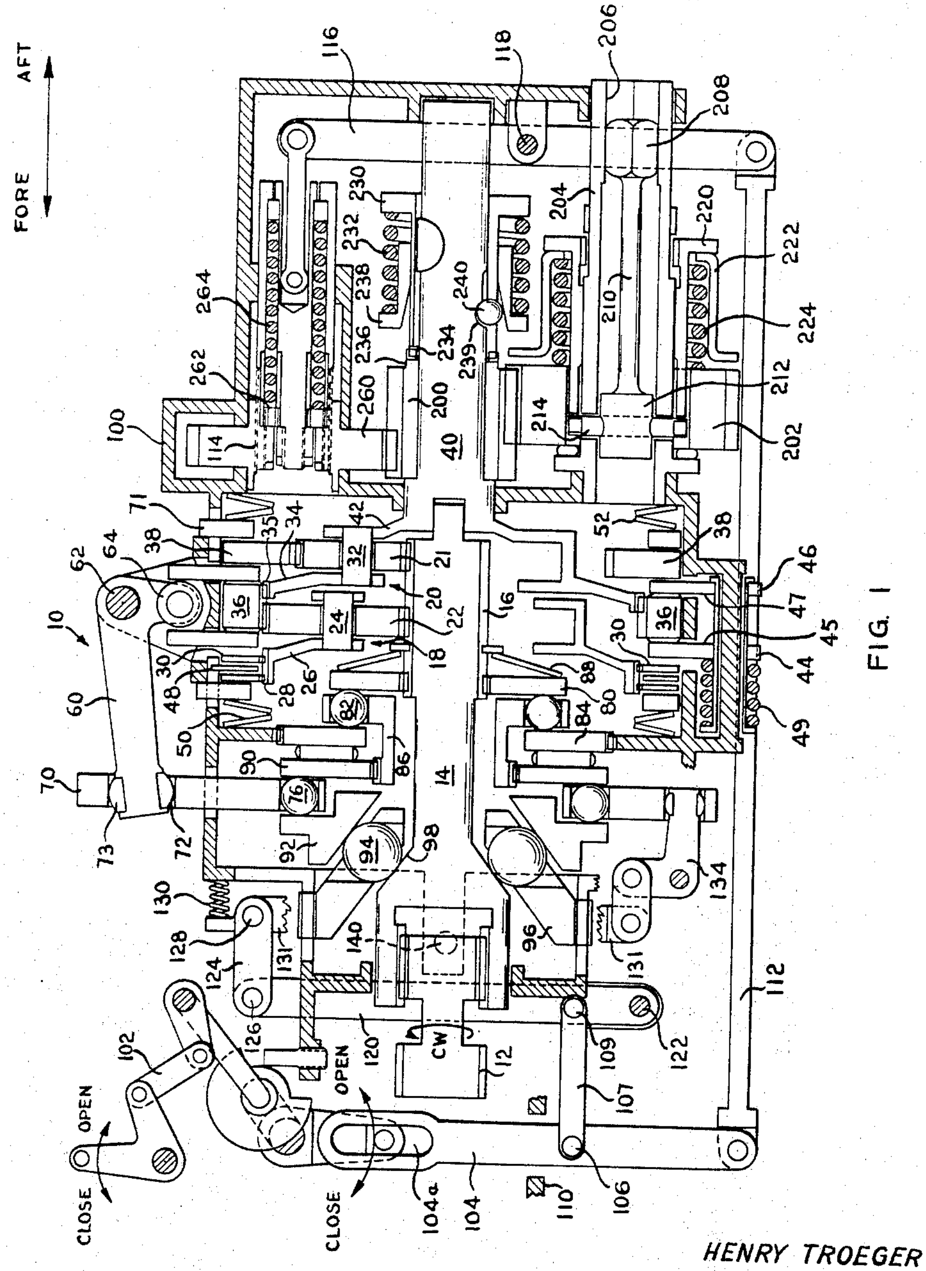
FIGURE 1 is a schematic of the power amplifying position and control unit shown in a longitudinal view.

In order to facilitate understanding of the present invention and the embodiments therein shown in the drawings and to be discussed herein, the various sub-assembly mechanisms will be discussed in detail and the operation of the overall unit will be later indicated and described in some detail.

FIGURE 1 shows a complete assembly of the power amplifier position control system and FIGURES 2 through 6 show in greater detail the major sub-assemblies and sub-parts which make up a complete assembly. The drive, stationary lock and reversing mechanism, shown in FIGURE 2, comprise what may be thought of as the power amplification stage of the power amplifier position control system. The brake actuator and feedback elements, shown in FIGURE 3, comprise what may be thought of as the first or signal amplification stage of the power amplifier position control unit in which the input and output signals are compared and used to control the power stage or drive stationary lock and reversing mechanism stage of the power amplifier position control unit.

*Drive, stationary lock and reversing system*

Figure 2:
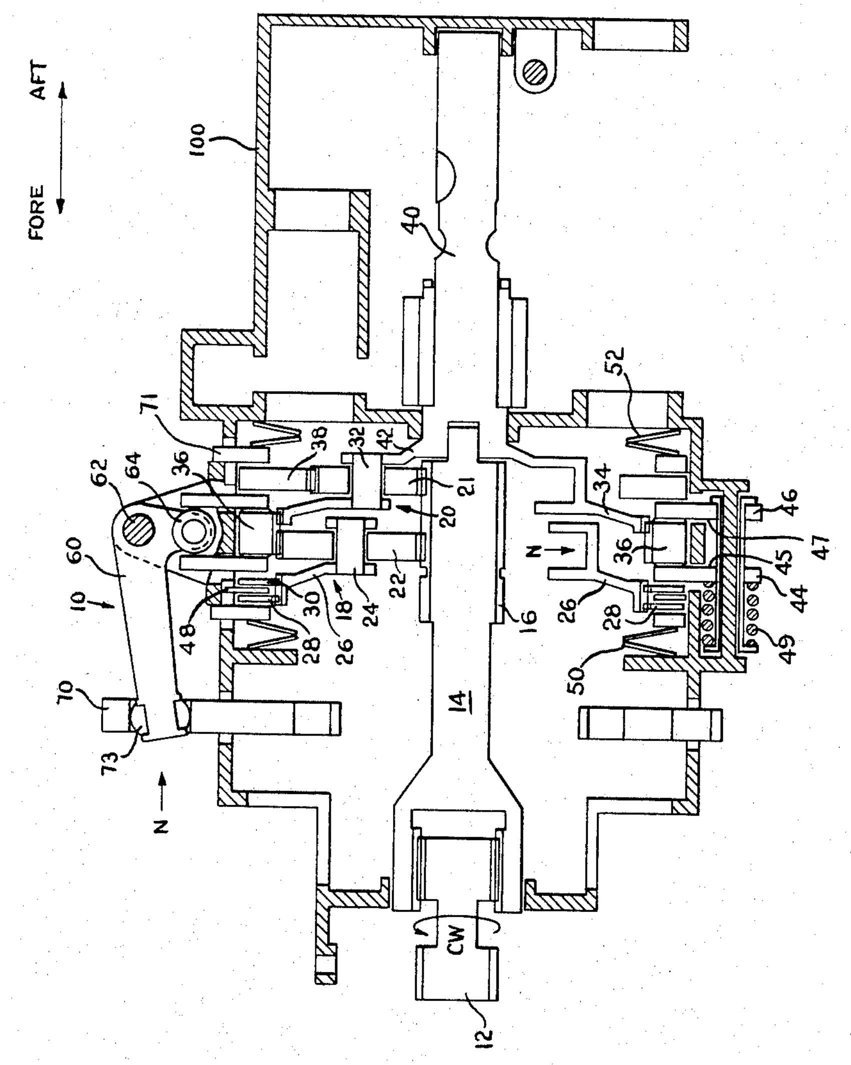
FIGURE 2 is a longitudinal schematic of a sub-assembly of the power amplifier position control unit showing principally the drive, stationary lock and reversing mechanism.

Turning now to FIGURE 2, a drive, stationary lock and reversing mechanism is indicated generally by the numeral 10. The mechanism has a rotating input spline 12 driving an input power shaft 14 which has a sun gear 16 thereon. The sun gear 16 drives first planetary gear mechanism shown geenrally by the numeral 18, and a second planetary gear mechanism shown generally by the numeral 20. The first planetary gear mechanism 18 has planets 22 which engage sun gear 16. The second planetary gear has planets 21 which engage the sun gear 16. A first planet carrier 24 supports the planets 22 between the sun gear 16 and the ring gear and braking mechanism 36. The planet carrier 24 has an extending member 26 which may be a flange or disc which has a toothed or splined surface formed thereon at 28 to engage brake discs 30. The second planet carrier 32 has an extending member 34 which may be a flange or disc with a toothed or splined surface 35 formed thereon to engage the first ring gear 36. The second planets 21 engage the sun gear 16 and the second ring gear 38. The main output shaft 40 is connected to the second planet carrier 32 by a radially extending member 42 which may also be a flange or disc.

First and second pressure plates 44 and 46 have friction surfaces 45 and 47, respectively, adapted to grip the ring gear holding brake member 36 when the drive mechanism is in a neutral position because of the resilient bias of spring member 49. The pressure plates are actuated by arms 60 pivoted about shaft 62, having actuating rollers 64 thereon. The arms 60 engage the cam disc device 70 whose position control will be later described. Actuation of the bell crank arm 60 "up" or "down," as shown in the drawing, propels the rollers 64 "fore" and "aft" as shown in the drawing, thereby actuating the pressure plates 44 and 46 in a manner to be described.

When the reversible planetary gear mechanism is in a neutral position, indicated on FIGURE 2 by letter N, the first planetary gear 36 and holding brake ring is held stationary by the pressure plates 44 and 46, brake 30 and ring 38 are released and the sun gear is merely rotating the planets 22 without driving the main shaft 40. At the same time, the second ring gear 38 is, as previously noted, free to move and is, in turn, driven by the sun gear 16 through the planets 21, enabling the main drive shaft 40 to remain unpowered. Assuming that the rollers 64 are then moved in a forward direction (i.e. in the direction indicated by "fore"), the brake discs 30 engage the stationary brake discs 48 which are splined to the housing 100 and biased by spring 50, thereby preventing the rotation of the planet carrier 26 and releasing the first ring gear stationary lock 36. This action of the rollers 64 does not prevent the rotation of the second ring gear member 38 which allows second planet gear member 21 to rotate about their own axis, thereby neutralizing the power input to the second planetary gear set 20 from the sun gear 16. It will be assumed that the input power shaft 12 is rotating in a clockwise direction as shown by the arrow marked CW in FIGURE 2. The first planet carrier 24 is prevented from rotation by the brake discs 30 and 48, and the first ring gear 36 is free to rotate in a counterclockwise direction which, in turn, carries the second planet carrier 32 in a counterclockwise direction and, because of its connection through flange 42 to the main shaft, rotates the shaft 40 in a counterclockwise direction.

If, on the other hand, the roller 64 had been moved in the direction indicated "aft" in the drawing from a neutral position, the direction of rotation of the shaft 40 would be reversed. Briefly, its action would be as follows: As the rollers 64 moved aft, the pressure plate 46 engages by its friction surface the second ring gear 38 and presses it against the braking member 71 to stall or prevent the rotation of the second ring gear 38 while at the same time releasing for rotation the first ring gear drive lock member 36. The main shaft 14, rotating in a clockwise direction, rotates the planets 21 in a counterclockwise direction which carries the planetary cage 32 now free to rotate in a clockwise direction and causes the rotation of the main shaft 40 to be clockwise as shown in the drawing. In this condition, the first ring gear 36, the first planet carrier 24 and the second planet carrier 32 are free to rotate. In summary, it can be seen that the main drive shaft 40 may be driven in either a clockwise or a counterclockwise direction by the control of the position of the rollers 64 which, in turn, are positioned by the disc 70. By making the number of teeth in the second ring gear member 38 equal to the sum of the number of teeth in the sun gear 16 and the first ring gear teeth, the reduction ratios for drive in the forward and reverse or clockwise and counterclockwise directions can be made equal.

Figure 6:
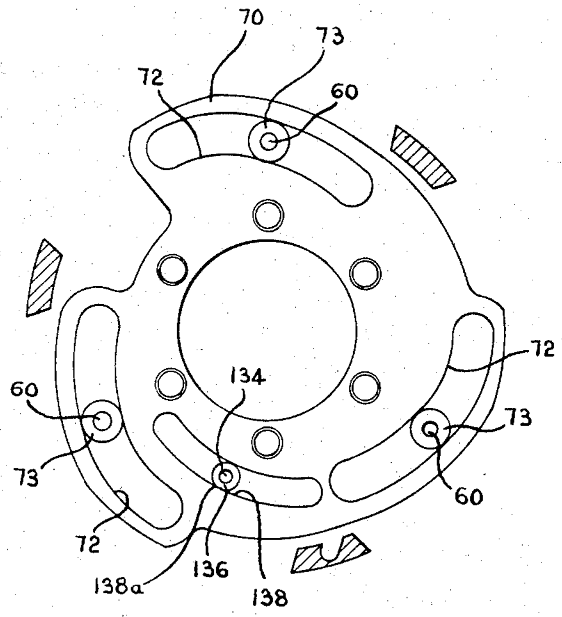
FIGURE 6 is a view of a cam disc used in a direct and feedback control of the braking elements shown in FIGURE 2.

As can be understood from the explanation of FIGURE 2, control of the direction or rotation of the main shaft 40 is dependent upon control of the rollers 64 which are, in turn, controlled by the arm 60 which rides in a cam disc 70, shown in an end view in FIGURE 6, having a contoured cam surface 72 formed therein. The cam surface 72 is generally an Archimedean spiral. If the cam surface 72 is such that it causes a radial motion of the arm 60, the rollers 64 will, of course, be caused to move "fore" and "aft" by virtue of the pivot point connection 62, shown in FIGURE 1. Cam disc 70 is rotated or positioned by the output rotation control mechanism.

*Output control system*

Figure 3:
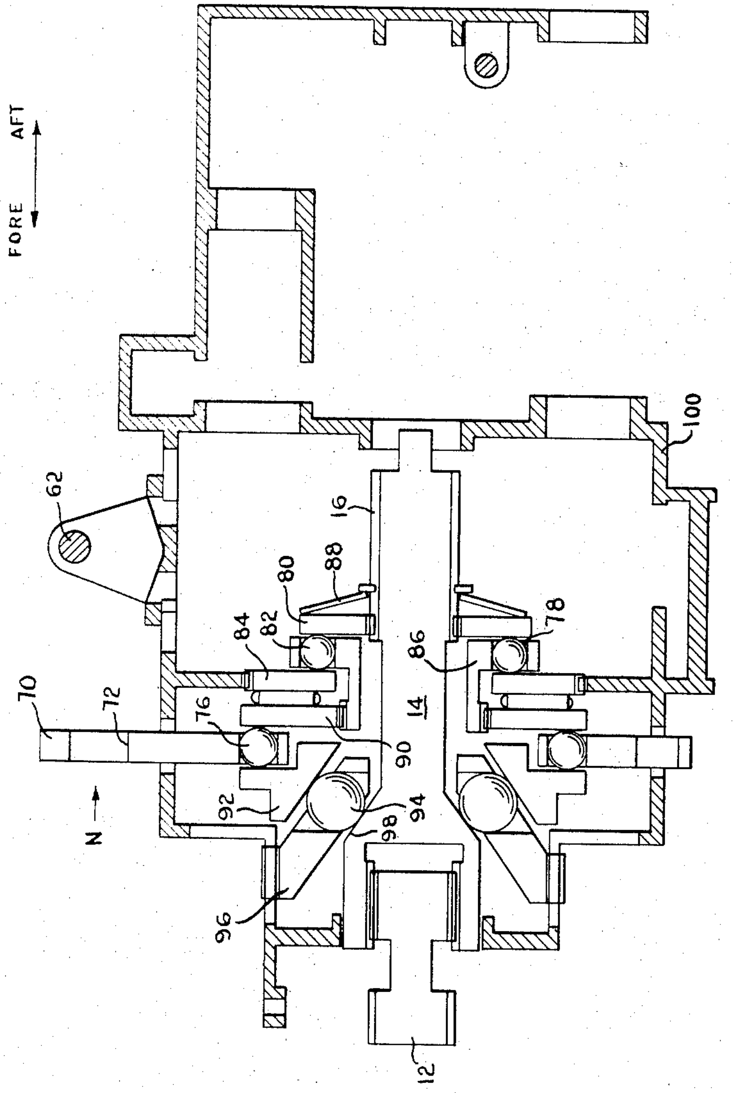
FIGURE 3 is a fragmentary longitudinal view of the control unit system output direction control mechanism.

The output control mechanism in the present embodiment of this invention comprises a ball drive mechanism of the following parts (shown in FIGURE 3 in detail and in FIGURE 1). Those skilled in the art will recognize that various other variable speed drives employing hydraulic elements as other friction drive elements could be employed. Further, although spherical and conical geometrical elements are shown in the present embodiment, those skilled in the art will recognize that other shaped elements could be employed. An input drive plate 80 is biased by a spring 88 into contact with a plurality of input ball members 82 which are, in turn, contacted by stationary reaction plate member 84 which is splined to the housing 100. A cage member 86 is thus driven by the ball members 82 at a speed half of that of the input shaft 14 and in a clockwise direction as shown in reference to the drawing. The cage 86 has a splined connection to a speed reference drive plate 90 which grips cam disc ball members 76 between it and a variable speed reference drive plate 92. A variable speed ball cage 96 splined to the housing 100 for axial movement with respect to the housing has a plurality of ball members 94 which ride on an inclined conical surface 98 of the input shaft 14 between that conical surface 98 and an inclined surface of the variable speed reference drive plate member 92. As the position of the ball members 94 varies on the conical surface 98, the speed of rotation of the variable speed reference drive plate member 92 will be affected.

If ball members 94 move without slipping on inclined surface 98, then ball members 94 must have the same instantaneous angular velocity as the inclined conical surface 98 at the point of contact between the ball members 94 and the inclined surface 98. The instantaneous angular velocity of a point on a curved surface which can be considered to rotate about a point is proportional to the product of the number of revolutions per unit time and the length of the radius vector at the point. Although any point on the inclined surface 98 has, for any given time increment, the same number of revolutions, the radius vector's length is variable, causing the instantaneous velocity of the ball members 94 to change. Changing the point of contact between the inclined surface 98 and the balls 94 causes the point of contact between the balls 94 and the inclined surface of the variable speed reference drive plate member 92 to change, thereby also changing the radius vector through which the speed reference drive plate member 92 is driven by the balls 94. However, this change in radius vector through which the reference drive plate member 92 is driven is less as a percentage of the total radius vector length than that change in the radius vector of the inclined surface 98 which is driving the balls 94.

Assuming that the balls 94 are in a position on the conical surface 98 such that ball bearing elements 94 contact the second cam disc drive plate 92 at a radius exactly twice that of their contact with the conical surface 98, the second cam disc drive plate 92 will be driven in a counterclockwise direction at a speed equal to one-half the speed of input shaft 14. When the balls 94 are in the assumed position, this is a neutral drive position for the cam disc member 70 and results in no output of the main shaft 40 since balls 76 spin on their own axis and do not rotate about shaft 14. The zero output results in the fact that the second cam disc drive plate 92 is rotating in a counterclockwise direction at a speed equal to one-half the input speed, while at the same time the first cam disc drive plate 90 is rotating in a clockwise direction at an equal speed. This causes the balls 76 to turn within the cam disc member 70 without causing its rotation.

Should, however, the variable speed ball cage 96 be moved "fore" or "aft" on the conical surface 98, the second cam disc drive member 92 would no longer be operating at half the speed of the input shaft 14 (as previously explained) and the balls 76 would power or drive the cam disc member 70 in the direction of the faster of the rotating pressure plate members 90 or 92 at a speed equal to the difference between that of the rotation of the first and second cam disc drive plate members. Rotation of the cam disc drive member 70 causes the rollers 73 to follow the contour of the cam surface 72 and to change radius with respect to the main shaft 14, thereby moving the rollers 64 either "fore" or "aft" as referenced in the drawing.

Whenever the cam disc drive member 70 is displaced from the neutral position, shown by N in FIGURE 3, causing the rollers 64 to be displaced either "fore" or "aft" as shown in FIGURE 2, the output shaft 40 will be driven either counterclockwise or clockwise respectively. Rotation of the output shaft 40 over a period of time yields a position change in the output since the rotational velocity of the output shaft, multiplied by the time of rotation, gives a displacement or output position change.

*Control linking system*

Figure 4:
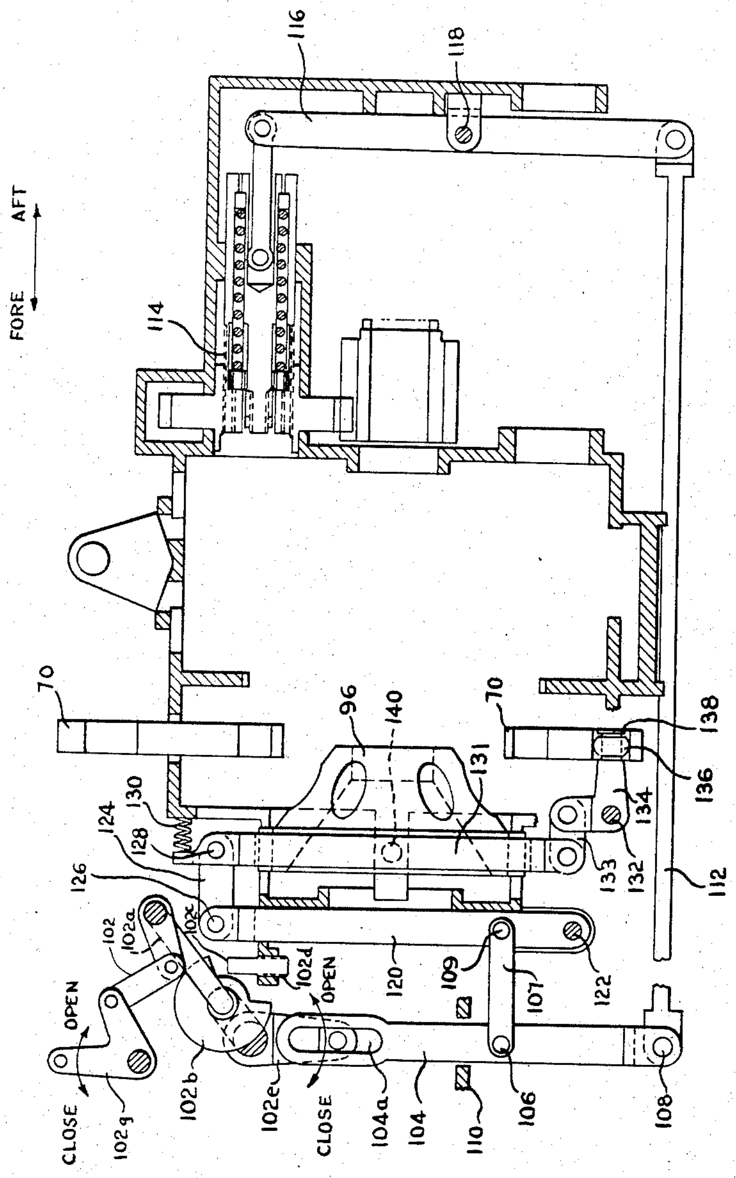
FIGURE 4 is a fragmentary longitudinal view showing the power unit control linkage system.

Turning now to FIGURE 4, there is shown control linkage elements for controlling the position of the variable speed ball cage member 96 which controls the direction and speed of rotation of the cam disc member 70 which, in turn, controls the direction and speed of rotation of the main shaft 40.

Input position signals fed into the power amplifier position and control unit through the multiple linkages shown generally by the numeral 102. Rotation of the input lever **102*g* in the direction indicated by "close" causes the rotation of the shaft 102*a* which causes the rotation of the linkage member 102*e* which is fixedly connected to the shaft 102*a* to position the summing bar 104. For clarity, the shaft 102*a* is shown in perspective in FIGURES 1 through 5, while all other portions of the linkage 102 are shown in plane view. All portions of the linkage 102 shown connected to shaft 102*a* are fixedly connected thereto. The summing bar 104 has a slot or lost motion connection 104*a* with the linkage 102*e* such that the rotary motion of the linkage 102*e* may cause reciprocal or translatory movement of the summing bar 104. The other end of summing lever 104 receives an output position signal from the feedback arm 112 which is pivotally connected to the summing lever 104 by pivot 108. Output position is sensed by threaded member 114 which is positioned by the output of the planetary gear drive system. A second feedback lever 116 is pivotally connected to the housing pivot 118 and interconnects the threaded member 114 and the feedback linkage 112. Input-output link 107 feeds the algebraic sum of the input position and output position supplied by the input arm 102*e* and the feedback arm 112, respectively, to the multiplying lever 120. The input-output member 107 is pivotally connected to the summing lever 104 at pivot 106 and to the multiplying lever by pivot 109. The multiplying lever 120 has a pivotal connection 122 to the housing and a connection through linkage 124 to a second summing lever 131. Connecting linkage 124 is pivotally connected to the error multiplying lever 120 by a pivot 126 and pivotally connected to the second summing lever 131 by pivot connection 128. A resilient or spring member 130 biases the second summing lever 131 to remove linkage backlash, and to bias the input lever 102*g* to a desired position. The second summing lever 131 is interconnected to the variable speed ball cage member 96 by a pivotal connection 140 which is able to cause the translation of the variable speed ball cage member 96. A feedback bell crank arm 134 rides in the cam disc feedback slot 136. The feedback bell crank arm 134 is pivotally connected to the housing by pivot 132 and has a linkage 133 which is pivotally connected between the bell crank arm 134 and the summing lever 131. Thus, the summing lever 131 is sensing the multiplied difference between input position and output position of the cam disc member 70**.

Saturation of the amplifier is prevented by the stops which are shown schematically by member 110 which abut the first summing member input lever 104. The disc segment **102*b* serves as a maximum-minimum input and it cooperates with the saturation or overload stops 102*c* and 102*d* to prevent overloading of the amplifier. As the shaft 102*a* is rotated either by movement of the input lever 102*g* or by movement of the summing bar 104. As the shaft rotates about its longitudinal axis, the disc segment will abut either of the stops 102***c* or 102*d* after a limited amount of rotation.

The cam disc member 70, shown in plane view in FIGURE 6, is an important functional element of the control unit. The cam disc 70 consists of a plurality of cam slots 72 which are contoured to cause the movement of the bell crank arms 60 which position the holding and output brakes. Rollers 73 are connected to the bell crank arm 60 and ride in the contoured slot 72. A feedback slot 138 is contoured to actuate feedback bell crank arm 134 which rides on roller 136 in the contoured slot 138. The slot 138 is formed in an Archimedean spiral, and has a deadband region 138*a* in which no movement of the feedback arm 134 occurs. This deadband portion 138*a* may be of a variable extent so that the timing of the feedback positioning of the cam disc 70 may be controlled so that sufficient braking torque is available to brake members, so that no continuous sliding friction occurs during the operation of the power amplifier position control unit.

Briefly turning now to FIGURE 1, an output feedback gear 260 is driven by the main drive gear 200. The output feedback gear 260 is journalled in the housing 100 and has a threaded inner diameter which is engaged by a threaded member 114 which is operatively connected and spring biased by spring 264 to output position feedback member 262. The spring 264 serves as a double acting overstauration spring so that when disc segment 102*b* abuts either stop 102*c* or 102*d*, or summing lever 104 abuts stop 110 and linear movement of the feedback linkage is terminated, the threaded member 114 is still capable of linear motion. This is necessary, since output feedback gear 260 and member 114 are threaded together and gear 260 may still be turning after the linear motion of the feedback linkage has been terminated.

Assuming that the drive is in neutral and that the output shaft 40 is not rotating, the ball drive cage 96 is thus in a neutral position and the ball bearings themselves are driving the second cam disc drive plate counterclockwise at one-half the input power shaft speed. If now the operator decides to open, for example, let us say, the exhaust nozzle, the input linkage 102 is moved in the open direction which causes a lever 104 to pivot in the "aft" direction as referenced in the drawing which, in turn, through the multiplying lever 120, the connecting arm 124 and the second summing lever 131, causes the variable speed ball cage member 96 to be moved aft. This action reduces the speed of the second cam disc plate drive member 92 and causes the cam disc 70 to rotate in a clockwise direction, thereby actuating the control arm 60 and in the embodiment shown, because of the contour of the cam slot 72, causing the arm to be pulled radially inwardly, thereby positioning the roller 64 in an "aft" direction, causing the main shaft 40 to be driven in a clockwise direction. As the output position sensing member 114 detects the correct output position since it, through the feedback linkages 116 and 112, repositions the input-output lever 104 and will again cause the variable speed ball drive cage 96 to return to a neutral position. Cam disc 70 position is continuously sensed by rollers 136 rolling in cam slot 138 which is fed to second summing lever 131 connected to the variable speed drive member 96 by feedback arm 134. Thus, the control linkage system relays to the variable speed ball drive mechanism 96, both input and output position and cam disc position. Feedback linking arm 134 will cause the cam disc 70 to return to a neutral position, as input signal and output position signal indicate that the desired output position is attained. Feedback arm 134 positions the second summing lever 131 as a function of cam disc 70 position. Positioning the second summing lever 131 positions the variable speed ball cage 96 through the pivot connection 140*a*. Positional feedback of the summing lever 131 by the feedback arm 134 is effected only after sufficient cam disc 70 rotation is achieved to assure that the braking forces holding the first planetary gear cage 24 or the second ring gear 38 are sufficient to carry the full torque transmitted to those members. The delay in positional feedback is achieved through the deadband region 138*a* formed in the cam disc contoured feedback slot 138. As the desired output position is achieved, the cam positional feedback arm 134 will position the variable speed ball cage 96 such that the cam disc 70 will reverse rotation and return to a neutral position.

*Output and overload release system*

Figure 5:
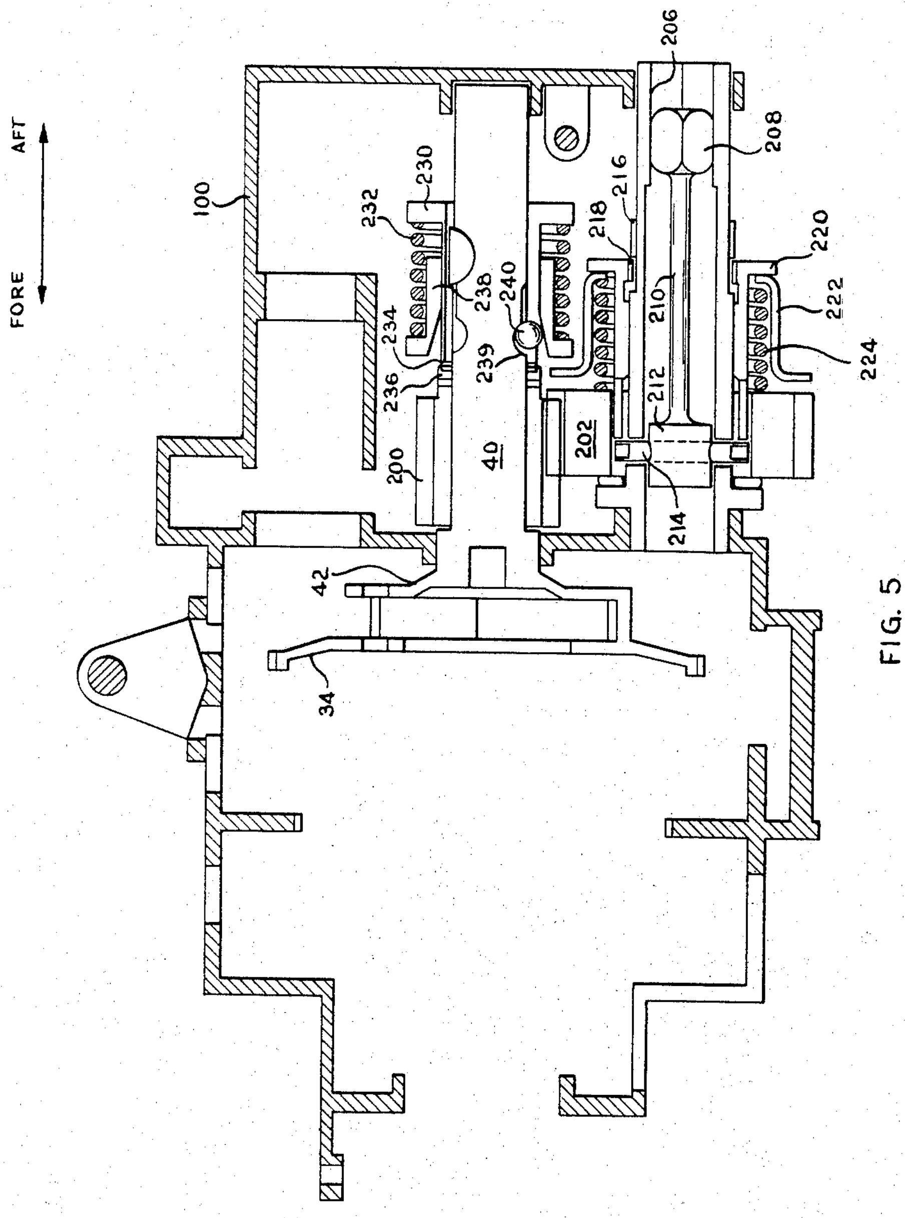
FIGURE 5 is a fragmentary longitudinal view of the power unit showing the output gearing and the overload release device.

The output mechanism and the torque release safety mechanism are shown in detail in FIGURE 5. Normally rotatable with main drive shaft 40 is main drive gear 200 which engage output gears 202, normally rotatable with output shafts 204. Output gears 202 are disposed about main drive gear 200 and are driven at a reduced speed from and in the opposite direction of main drive gear 200. An overload mechanism is provided to disconnect all of the output drive shafts from the load if an excessive torque load occurs in any output drive shaft. The output shafts have an adapter or drive end 206 formed therein to receive the mated end 208 of the torque sensing device 210. On the other end of the shafts 210 is a head 212 having a keyway for receiving key 214. The key 214 interconnects the output drive gear 202 to the torque measuring shafts 210. Output shaft sleeves 220 have splines 218 which are normally mismatched with splines 216 of the output shafts and are biased in the mismatched position by a latch or spring retainer 222 which is compressively confining a spring 224 between the output gears 202 and the output shaft sleeves 220. If excessive torque is developed along a torque measuring arm 210, the keyed head end of the arm 212 will rotate with respect to the adapter 208 and cause an output gear 202 to rotate relative to an output shaft 204. This rotation will cause the mismatched splines 216 and 218 to become matched and the sleeve 220 will be propelled down the output shaft 204.

The main shaft 40 has a sleeve member 230 slidably journalled thereon which has dentil teeth or curvice 234 formed on one end thereof which mate with or engage similar torque transmitting teeth 236 formed on the transverse end of the main drive gear 200. A latch member 238 having a conical interface is resiliently biased by spring 232 to hold ball bearing members 240 in annular groove 239 formed in the output shaft 40 to keep the torque transmitting teeth 234 and 236 normally in engagement. When, however, due to excessive torque, an output shaft sleeve 220 is propelled "aft," as referenced in the drawing, it will engage the main shaft latch member 238 and pull it "aft" as shown in the drawing. As the main latch member 238 is moved "aft," the ball bearing members 240 are released, allowing the spring 232 to propel the main sleeve 230 "aft," causing disengagement of the tooth surfaces 234 and 236, thereby disconnecting the output from the control device.

*Operation*

Turning now to FIGURE 1 wherein a schematic of the power amplifier position control unit is shown. In operation, the unit acts as follows: Assuming that the power amplifier is in a neutral position and that the output is in a position which is stable with respect to the input wherein the input control linkage 102 is moved in the "open" direction as indicated in the drawing, it will position the input-output summing lever 104 in the "fore" direction as indicated in the drawing. This movement of the summing lever 104 will be transmitted by the linking member 107 to the multiplying lever 120 which, in turn, will multiply the force and then transmit it to the second summing lever 131 which, through the pivot connection 140, will move the variable speed ball cage member 96 in the forward direction and cause the cam disc drive plate 92 to be driven faster in the counterclockwise direction. This, in turn, will cause the balls 76 to translate, causing the motion of the cam disc 70 and, in turn, the bell crank arm 60 which positions the brake members. Counterclockwise motion of the cam disc 70 will cause the bell crank arm to be moved in the "upward" direction, as referenced in the drawing, and will cause the actuation of the pressure plate 44 to be moved in the forward direction, causing the engagement of the brake discs 30 with the brake member 48 to prevent the rotation of the planet carrier 24 and releasing the first ring gear at holding brake member 36. In this condition, the input shaft 12 transmits power through the sun gear 16 to the planet gear member 22 which causes the rotation of the first ring gear 36 which, in turn, is engaged by the first planet carrier 34 with gears 35 formed thereon and causes the rotation of the planet carrier 32 which is mechanically linked through the arm 42 to the main output shaft 40. The rotation of the main shaft 40 is in the counterclockwise direction. Conversely, if the power amplifier position control unit has been in the neutral position to begin with and the linkage 102 has been moved in the "closed" direction, this would cause the levers 104 and 120 to be moved "aft," causing the movement of the variable ball speed cage member 96 to be "aft" and decreasing the speed of the first cam disc drive 92. Decreasing the speed of the drive 92 would cause the balls 76 to rotate about the main shaft 14 in a clockwise direction and would pull the bell crank arm inward relative to the housing. This motion of the bell crank arm would move the pressure plate 46 "aft" as shown in the drawing and would prevent the rotation of the second ring gear member 38. In this mode of operation, the input gear 12 is rotating the sun gear 16 which causes the rotation of the planet gear 21 and the planet carrier 32 is rotated in a clockwise direction. The rotation of the planet carrier 32 is linked through the arm 42 to the main output shaft 40 which is rotated in a clockwise direction also. The first planet gear 22 has a first ring gear 36 which is free to rotate and transmit no torque. If, as in the embodiment shown, the number of teeth in the second ring gear member 38 equals the sum of the number of teeth on the sun gear 16 and the number of teeth on the first ring gear 36, then the gear reduction ratio in both directions is equal.

It can be seen that the device is clearly able to accomplish its stated objects. It is a fully automatic, self-contained, power amplifying and position control unit in which even small differences between input and output are capable by virtue of the integrating nature of the variable speed elements of providing sufficient energy to operate the brakes as necessary to provide adequate torque to reposition the output and reduce the error to an acceptable value. The device can be made as sensitive to variations between the output position and input selector position as is desired. It can be seen that from the small inertia of the control system that response time is quite short and that positioning can be exceedingly precise. The device is self-protecting in that its overload release mechanism will prevent damage to the unit. Further, the overload release can be readily and easily manually reset by any one of a number of known methods. The reference directions shown and described have been shown merely for the purposes of description and are not to be deemed limiting in any sense. The device is, of course, capable of operating at a wide range of physical environments. It may be air cooled and does not need separate cooling. Furthermore, the device is non-inertial and will operate in a zero gravity environment.

It can be readily appreciated that by positioning the input lever that in turn, the variable speed ball cage 92 is positioned to control the cam disc member 70 which, in turn, controls the braking mechanisms to determine which directions, if any, the output shaft 40 will be driven. The feedback from output position is furnished by the output position threaded member 114 and is, in turn, fed around to the input position levers. Further, of course, the control mechanism, the cam disc, has a feedback arm which is connected to the variable speed ball cage member.

What is claimed is:

1. In a power amplifier control the combination comprising:

a power input means;
an input signal means;
an output signal feedback means;
a power output means;
a reversible drive means driven by said power input to control said power output means responsive to input signal and feedback signal;
said reversible drive means having a driving connection to said power output means;
variable speed drive means driven by said power input means and responsive to the difference between input and output signals, and
brake means actuated by said variable speed drive means to selectively idle without sliding friction or establish a drive through said reversible drive means.

2. The power amplifier position control means as claimed in claim 1 wherein:

said variable speed drive means comprises a ball cage drive means.

3. The power amplifier as claimed in claim 1 including further:

an overload release means for disconnecting the input from the output if any part of the output receives an overload.

4. The power amplifier control as claimed in claim 1 wherein:

said power input means includes a sun gear means;
said reversible drive means includes first and second planetary gear sets mounted on first and second gear carrier means and engaging first and second ring gear means; and
said brake means operative to selectively prevent said first and second ring gear means and said first and second gear cage means from rotation.

5. The power amplifier control as claimed in claim 4 wherein:

said brake means includes a plurality of pressure plate members adapted to prevent said first ring gear from rotating when in a neutral position and to prevent said first gear cage means from rotation when said pressure plates are in a first position, and to prevent said second ring gear from rotation when said pressure plate is in a second position.

6. The power amplifier control as claimed in claim 5 wherein:

a rotatable cam disc means is rotatably positioned by said ball cage drive means;
said rotatable cam disc means having an internal guide path; and
a linking means interconnecting said cam disc internal guide path to said plurality of pressure plates.

7. The power amplifier control as claimed in claim 6 wherein:

said ball cage drive means includes a first and second cam disc drive means, said first cam disc drive means adapted to be driven in an opposite direction from said second cam disc drive means proportionally to the difference between the input signal and the output signal.

8. The power amplifier control as claimed in claim 7 wherein:

said rotatable cam disc means is driven by said ball cage drive means at a speed proportional to the difference between the speed of said first and second cam disc drive means and in the direction of the faster of said cam disc drive means.

9. The power amplifier control as claimed in claim 8 wherein:

said ball cage drive means includes a drive cone means adapted to be driven by said power input means to drive said first cam disc drive means.

10. In a power amplifier control the combination comprising:

an input power shaft means;

a reversible planetary gear means driven by said input power shaft means;

a first drive plate means rotatably driven by said input power shaft means;

a second drive plate disposed in a fixed position relative to said input power shaft means;

a first ball cage means disposed between said first and second drive plate means having a plurality of ball bearings in contact with both of said drive plate means whereby said ball cage means is adapted to be driven proportional to input;

a third drive plate means having *toothed* engagement with said first ball cage means;

said input power shaft means including a driving cone means;

a fourth drive plate means disposed intermediate of said third drive plate means and said driving cone means;

a cam means having a plurality of ball bearings in contact with said third and fourth drive plate means;

a variable speed ball cage means having a plurality of ball bearings in contact with said driving cone means and said fourth drive plate means, said ball cage mounted for axial movement relative to said driving cone means to vary the drive ratio to said fourth driving plate means;

said cam means position varying as a function of the difference between the drive ratio of said fourth drive plate means and said third drive plate means; and brake means operative in response to the position of said cam means to control the rotation of said planetary gear means.

11. In a power amplifier control the combination comprising:

an input power shaft means;

an input position signal means;

a reversible planetary gear means driven by said input power shaft means;

an output means driven by said planetary gear means;

a braking means to control the direction and velocity of rotation of said planetary gear means;

a cam disc means operative to control said braking means;

a plurality of ball drive means driven by said input power shaft means, said ball drive means having sensing means to detect input position signal output position and the difference therebetween; and said ball drive means operative to control said cam disc means.

12. The power amplifier control as claimed in claim 11 wherein:

said plurality of ball drive means comprises a first cam disc drive means adapted to be driven at a ratio of one-half input power shaft and a second cam disc drive means rotating in a direction opposite to said first cam disc drive means at a speed different from or equal to one-half input power shaft speed.

13. The power amplifier control as claimed in claim 12 wherein:

said cam disc means includes a plurality of balls disposed in a cam surface intermediate said first and second cam disc drive means; and said balls means adapted to cause said cam disc means to rotate at one-half the speed difference of said first and second cam disc drive means and in the direction of the faster of said cam disc drive means.

14. In a power amplifier for a control the combination of:

an input signal means;

an output position means;

a control means including a planetary gear and brake means for positioning said output position means;

a ball drive means for regulating said control means;

an output position feedback means interconnecting said output position means and said ball drive means;

said input signal means connected to said ball drive means; and feedback means interconnecting said control means to said ball drive means.

15. The power amplifier position control claimed in claim 14 wherein:

said output position feedback means comprises a member threadedly received on a shaft, said member positioned by said control means; and a lever means resiliently connected to said threadedly received member and further connected to said ball drive means.

16. The power amplifier control as claimed in claim 15 wherein:

said ball drive means comprises a variable speed ball cage means having a rotational speed proportional to position relative to said input signal means;

a first linking means pivotally connected to said variable speed ball cage means resiliently biased to a neutral position on one side of said pivot and connected to said control means feedback; and a second linking means interconnecting said input signal means and said output signal means adapted to detect the difference between said input and output signals connected to said first linking means on said resiliently biased side.

References Cited

UNITED STATES PATENTS

| | | | |
|---|---|---|---|
| 1,674,143 | 6/1928 | Stroud et al. | 74—388 |
| 2,341,989 | 2/1944 | Horstmann | 74—388 |
| 2,540,989 | 2/1951 | Newell | 74—388 |
| 2,834,843 | 5/1958 | Auger | 74—388 X |
| 3,048,050 | 8/1962 | Perryman | 74—388 |
| 3,151,493 | 10/1964 | Geyer | 74—388 |

FRED C. MATTERN, Jr., *Primary Examiner.*
THOMAS C. PERRY, *Assistant Examiner.*